United States Patent
Malueg et al.

(10) Patent No.: US 7,174,420 B2
(45) Date of Patent: Feb. 6, 2007

(54) TRANSACTION-SAFE FAT FILE SYSTEM

(75) Inventors: Michael D. Malueg, Renton, WA (US); Hang Li, Redmond, WA (US); Yadhu N. Gopalan, Redmond, WA (US); Ronald Otto Radko, Kirkland, WA (US); Daniel J. Polivy, Seattle, WA (US); Sharon Drasnin, Seattle, WA (US); Jason Ryan Farmer, Redmond, WA (US); DaiQian Huang, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 701 days.

(21) Appl. No.: 10/431,009

(22) Filed: May 7, 2003

(65) Prior Publication Data

US 2004/0078704 A1 Apr. 22, 2004

Related U.S. Application Data

(60) Provisional application No. 60/420,541, filed on Oct. 22, 2002.

(51) Int. Cl.
*G06F 12/00* (2006.01)
(52) U.S. Cl. .................................................. 711/112
(58) Field of Classification Search ............... None
See application file for complete search history.

(56) References Cited

U.S. PATENT DOCUMENTS

| | | | | |
|---|---|---|---|---|
| 5,546,389 | A * | 8/1996 | Wippenbeck et al. ....... 370/412 |
| 5,734,340 | A * | 3/1998 | Kennedy ....................... 341/59 |
| 5,813,011 | A * | 9/1998 | Yoshida et al. .............. 707/101 |
| 5,907,672 | A * | 5/1999 | Matze et al. .................... 714/8 |
| 6,032,223 | A * | 2/2000 | Beelitz ......................... 711/104 |
| 6,037,738 | A * | 3/2000 | Morita et al. ................ 318/625 |
| 6,205,558 | B1* | 3/2001 | Sobel ............................ 714/15 |
| 6,378,031 | B1* | 4/2002 | Kuno et al. ..................... 711/4 |
| 6,615,404 | B1* | 9/2003 | Garfunkel et al. ........... 717/173 |
| 6,907,184 | B1* | 6/2005 | Yokota et al. ................. 386/52 |
| 2001/0016841 | A1* | 8/2001 | Karasudani ..................... 707/1 |
| 2002/0152354 | A1* | 10/2002 | Harmer ....................... 711/113 |
| 2003/0028765 | A1* | 2/2003 | Cromer et al. .............. 713/164 |
| 2004/0030847 | A1* | 2/2004 | Tremaine ..................... 711/154 |

OTHER PUBLICATIONS

Farr, Peisel, An Optimum Disc Organization for a Virtual Memory System, Computer Design, Jun. 1971, pp. 49-54.
Lee, Chiung-San, Server-Based Maintenance Approach for Computer Classroom Workstations; IEICE Trans.Inf.&Syst., vol. E83-D, No. 4, Apr. 2000.

* cited by examiner

*Primary Examiner*—Hyung Sough
*Assistant Examiner*—Duc T. Doan
(74) *Attorney, Agent, or Firm*—Lee & Hayes, PLLC

(57) ABSTRACT

In one aspect, the present disclosure describes a process for maintaining file allocation tables (FATs) for a volume of storage medium. The process includes triggering, by a write operation, modification of data in an existing sector of a data file by writing of data to a new sector of the storage medium. The process also includes writing revised used/unused sector information into one FAT and setting a variable indicative of a number of FATs (NOF) to a first value. The process additionally includes copying the one FAT to another FAT and re-setting the variable to a second value.

36 Claims, 7 Drawing Sheets

TRANSACTION-SAFE FAT FILE SYSTEM

RELATED APPLICATIONS

This application claims the benefit of U.S. Provisional Application No. 60/420,541, filed on Oct. 22, 2002, entitled "Transaction-Safe FAT Files Subsystem", listing Michael D. Malueg, Hang Li, Yadhu N. Gopalan, Ronald O. Radko, Daniel J. Polivy, Sharon Drasnin, Jason R. Farmer and DaiQian Huang as inventors, which is hereby incorporated by reference.

TECHNICAL FIELD

This disclosure relates to Transaction-safe File Allocation Table (TFAT) file systems designed to reduce the probability that a computer file system becomes corrupted in the event of power loss during a write cycle.

BACKGROUND

Computer systems employ multiple memory types, including ROM, volatile rapid access memories and non-volatile memories. ROM may be used to implement a basic input output system (a.k.a. BIOS) by having a power on reset circuit that causes the information stored in the ROM to be read and employed by a processor when the power is reset to the computer system. This is an example of a non-volatile memory, or a memory that retains stored data even when no electrical power is being supplied to the computer system.

Volatile rapid access memories, such as cache memories and dynamic random access memories (DRAMs), are used to store information elements such as data and instructions, and especially those information elements that are repeatedly needed by the processor. Volatile memories are incapable of storing data for any significant period of time in the absence of externally-supplied electrical power.

Computer systems typically include multiple non-volatile memory devices, which have evolved from punch card decks and paper tape systems, through large magnetic disc systems to include compact disc memories, floppy discs, small, high capacity disc systems, flash memory systems and other forms of non-volatile data storage devices.

Disc drive data storage systems are typically much slower than many other types of memory but provide high data storage capacity in a relatively attractive form factor and at a relatively low cost per stored bit. These types of memories include electromechanical components, and, accordingly, are limited in speed of operation. As a result, the probability that a power interruption may occur when data are being written to the device is increased, relative to some other types of memory. In order to be able to determine which data were written to the disc, and to be able to determine where on the disc the stored data are located, a file allocation table (FAT) system is employed. Several different kinds of FATs have been developed, including FAT12, 16 and 32, to address needs of different systems.

In a conventional FAT file system, when a file is modified, new data or changes to an existing file are written over and/or appended to a previous version of the file. Additionally, a log file is created of operations that will involve writing data to the non-volatile data storage device. Following writing of the new data or changes, the FAT is updated and the log is erased. Such FAT file systems track completed transactions, and are called "transactioned" file systems.

The conventional FAT file system is vulnerable to corruption from a "torn write", e.g., a write operation that is interrupted such as by an intervening power loss, or when storage media are disconnected during a write, because of the procedure used to store data. Should power fail after initiation of a write of new data to a file, but before or during the corresponding FAT write operation, the entire file system can be damaged or destroyed. While the likelihood of complete file system loss is small, there is a large probability of lost cluster chains that will require some form of servicing by a utility such as scandisk or chkdsk.

FAT file systems by design are not transaction-safe file systems. The FAT file system can be corrupted when a write operation is interrupted during a write transaction due to power loss or removal of the storage medium. The FAT is corrupted when the content of the FAT does not agree with the contents of the directory or data sections of the volume. When this happens, the user will lose some data.

This is not desirable in certain computer systems, such as those embedded computer systems where the data integrity is a high priority requirement. In order to reduce these data corruption issues, a new FAT solution is needed for such computer systems that also allows existing systems to access the storage medium and that is compatible with existing systems.

SUMMARY

A transaction-safe FAT file system is described. In one aspect, the system includes a process for maintaining file allocation tables (FATs) for a volume of storage medium. The process includes triggering, by a write operation, modification of data in an existing sector of a data file by writing of data to a new sector of the storage medium and writing revised used/unused sector information into one FAT. The process also includes setting a variable indicative of a number of FATs (NOF) to a first value, copying the one FAT to another FAT and re-setting the variable to a second value.

In one aspect, the FAT file system includes a directory creation process. The process includes allocating a first cluster on a non-volatile storage medium for a new directory and creating a first entry within the first cluster. The first entry represents a sector where the new directory is stored. The process also includes creating a second entry within the first cluster. The second entry represents a sector where a parent directory of the new directory is stored. The process additionally includes filling a remainder of the first cluster with data that a file system will not permit to be overwritten.

DETAILED DESCRIPTION

Figure 1A:
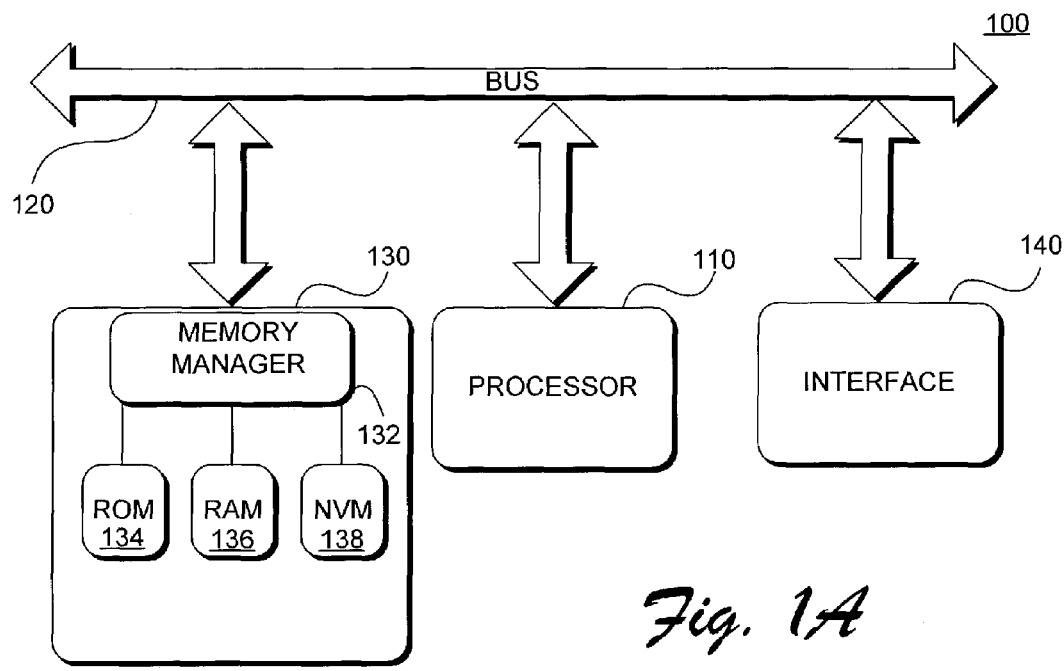
FIG. 1A is a block diagram of an exemplary embedded computer system including non-volatile memory.

FIG. 1A is a block diagram of a representative computer system 100. In one embodiment, the computer system 100 is embedded within an appliance or vehicle (not illustrated) and facilitates control of various subsystems, coordination between subsystems, data and usage logging and also facilitates interfacing with external computer devices (not shown). The computer system 100 includes a processor 110, a bus 120 coupled to the processor 110 and a memory system 130 coupled to the bus 120. The memory system 130 typically includes a memory management unit 132 coupled to the bus 120 and to ROM 134, temporary storage memory 138 such as DRAM or SRAM and non-volatile memory 138.

Non-volatile memory 138 may include non-removable media, which may include NAND/NOR flash memory and hard drives. Non-volatile memory 138 may also include removable media, such as Compact-Flash (CF) cards, Secure-Digital (SD) cards, magnetic or optical discs and other removable mass storage devices.

Discs are typically organized into portions known as "clusters" that are differentiated by addresses. A cluster is a sequence of contiguous sectors or linked sectors representing portions of a disc, for example. When a file is written to the disc, it may be written to one cluster or it may require several clusters. The several clusters containing data representing a file may be contiguous but often are not. As a result, it is necessary to have a master list of the clusters into which a given file is written and for the list to provide the order in which the clusters are organized. Such a list is referred to as a "chain" of clusters. A group of such lists form a portion of the TFAT. The TFAT thus is a tool for data retrieval that permits data to be read from the storage medium in an organized manner. Other types of storage media may be organized to mimic the organization of a disc in order to be able to be accessed intelligibly by modules that are based on a disc model.

Computer system 100 typically includes at least some form of computer readable media. Computer readable media can be any available media that can be accessed by computer 100. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other media which can be used to store the desired information and which can be accessed by computer system 100. Communication media typically embodies computer readable instructions, data structures, program logic or program modules or other data in a modulated data signal such as a carrier wave or other transport mechanism and includes any information delivery media.

The term "modulated data signal" means a signal that has one or more of its characteristics set or changed in such a manner as to encode information in the signal. By way of example, and not limitation, communication media includes wired media such as wired network or direct-wired connection, and wireless media such as acoustic, RF, infrared and other wireless media. Any of the above or combinations of any of the above should also be included within the scope of computer readable media.

The computer system 100 also includes one or more interfaces 140. Interfaces 140 may permit the computer system 100 to accept user input, for example via a keyboard, voice control, touch screen or other tactile, auditory, electrical or optical input device, and may permit information to be passed to a user via auditory or optical devices. Interfaces 140 may also couple the computer system 100 to an appliance (not illustrated), such as a global positioning system, or to a vehicle, or to other types of systems such as the Internet or other communications systems.

Interfaces 140 may also allow external computer systems (not shown) to interact with the computer system 100. For example, data such as accumulated distance traveled, service logs, malfunction logs applicable to associated subsystems, positional data describing historical performance data relevant to the computer system 100 and/or associated equipment and the like may be accessible to external computers via an interface 140. Similarly, modifications or upgrades to software associated with the computer system 100 may be coupled to the computer system 100 via an interface 140. Such could find utility in a vehicular application of the computer system 100, for example.

Alternatively, a removable portion of the non-volatile memory 138 may be decoupled from the computer system 100, temporarily or permanently, and interfaced with an external computer system (not shown), or vice versa. In either case, it is important to have some commonality of memory system organization to allow either the external computer system or the processor 110 to be able to read and/or write data to the memory system 130 or a detachable component of the non-volatile memory 138.

Figure 1B:
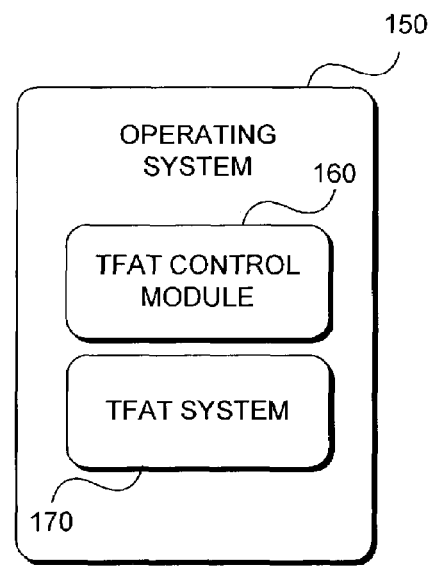
FIG. 1B is a block diagram representing an exemplary operating system and FAT file system suitable for use with the computer of FIG. 1A.

FIG. 1B is a block diagram showing an exemplary operating system 150 and TFAT file system 170 suitable for use with the computer 100 of FIG. 1A. The operating system 150 provides an environment in which applications may be employed by the computer 100. When the processor 110 encounters a write command, a TFAT control module 160 is invoked to cause the TFAT file system 170 coordinate with the write command as data are being written to the non-volatile memory 138.

Figure 2:
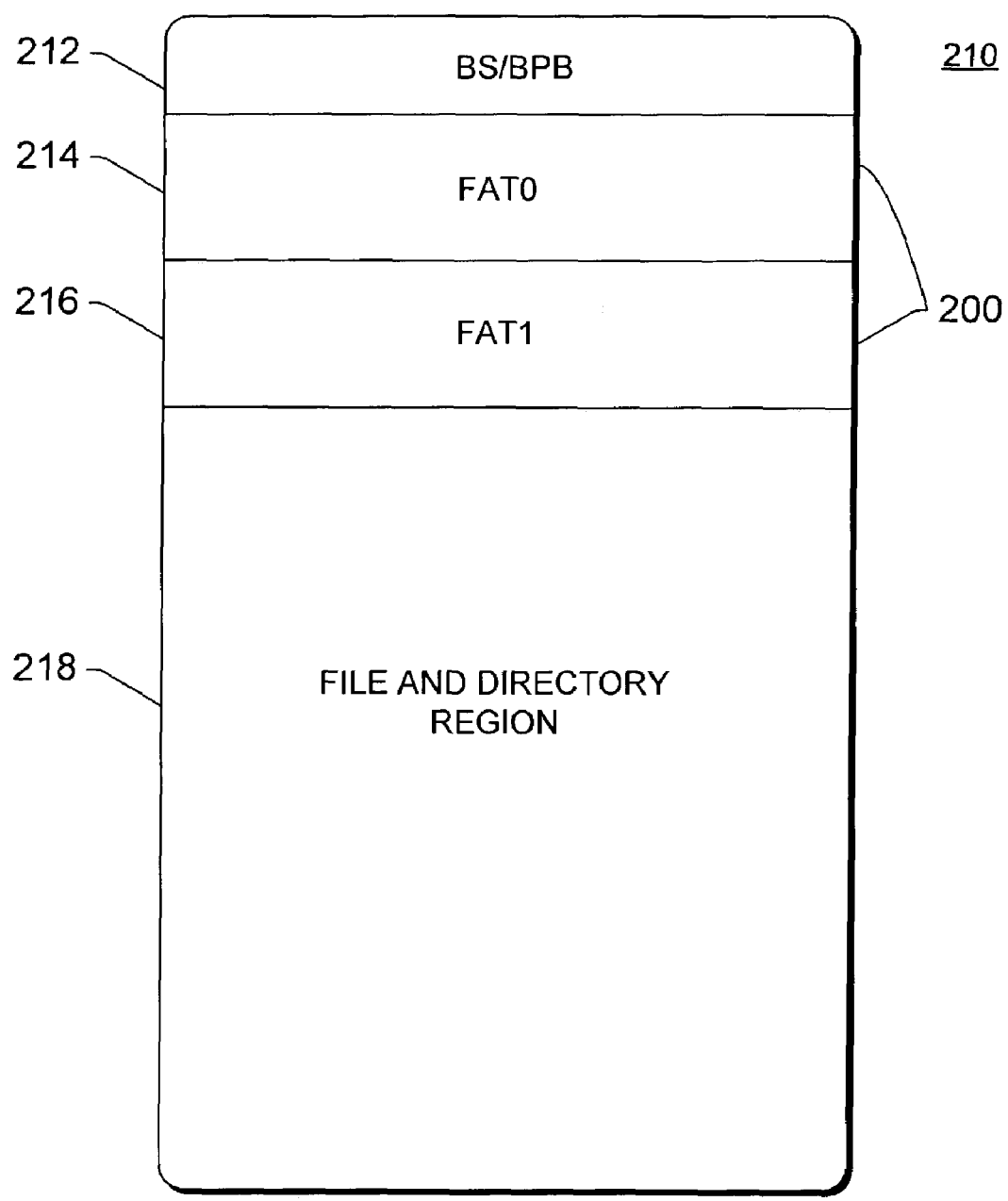
FIG. 2 is a block diagram representing an exemplary transaction-safe file allocation table (TFAT) file system implemented together with a volume of the non-volatile memory of FIG. 1A.

FIG. 2 is a block diagram representing an exemplary transaction-safe file allocation table (TFAT) system 200 (analogous to the TFAT file system 170 of FIG. 1B) implemented together with a volume 210 of the non-volatile memory 138 of FIG. 1A. The volume 210 includes a boot sector, BS/BPB 212, a first file allocation table FAT0 214, a second file allocation table FAT1 216 and a file and directory data region 218.

The following detailed description uses several terms of art. Definitions for some of these terms are given below.

STREAM. A stream is an abstraction of a file or directory and represents a continuous run of data, starting at offset 0, in one embodiment. Data can be read and written to the stream arbitrarily, and in arbitrary sizes by a file system. The file system maps the stream to the actual physical layout of the file on disk. An internal DSTREAM data structure stores information about the stream, and is often used in the file system code.

RUN. A run is a set of contiguous blocks of a file. Disk operations operate on contiguous data in a single operation. Accordingly, the run is an important part of all disk operations to a file or directory. The RUN data structure contains information about a run; the RUN structure stored in the DSTREAM contains information about the current run used in the last operation on the stream. The run usually contains information such as the starting and ending stream-relative offsets, and the volume-relative blocks corresponding to the offsets on disk.

Directory Entry (DIRENTRY). In one embodiment, DIRENTRY is a 32-byte structure. DIRENTRY contains information about a file or directory, and directories are composed of DIRENTRY structures. The internal DIRENTRY structure matches the format of the on-disk structure exactly.

BUFFER. A buffer is an internal data structure that is used to buffer data that has been read from non-volatile memory such as a disk. The BUF structure stores information pertinent to a buffer, such as its current status, volume-relative block number, and a pointer to the actual data. Unless stream I/O is done in individual block-size chunks, it goes through the buffer subsystem.

SID or Unique Stream Identifier. This is an internal data structure that represents a unique ID for internal stream structures. SIDs are used throughout the file system code as a means for identifying streams, and in file system notifications. The DSID structure contains the cluster of the directory which contains the stream's DIRENTRY, and the ordinal in the directory of the stream's DIRENTRY. In conventional FAT volumes, this is guaranteed to be unique for each file (stream), and to never change.

Conventional FAT file systems assume that the starting cluster of a directory will never change. As a result, such systems use the directory cluster numbers as part of Stream IDs (SID). In TFAT file systems, changes to the first cluster of a file/directory would also necessitate rewriting the directory entry, for reasons discussed in more detail below. If all directory entries were in the first clusters of their parents' streams, then these changes propagate all the way to the root (because each modification requires a write to a new cluster, and if it is the first cluster of a file/directory, the directory entry needs to be updated for that new cluster, and so on).

In many file systems, a conventional directory is merely a collection of 32-byte DIRENTRYs, one after another, starting with two special system directory entries that are typically represented as '.' ("dot") and '..' ("dot dot"). In a conventional FAT file system, these two system directory entries are associated with each directory, subdirectory and file stored on the storage device, except the root directory. With respect to each directory or subdirectory, the "dot" entry points to a current sector where the directory or subdirectory is stored. The "dot dot" entry points to a parent directory.

In one embodiment of TFAT, a modified directory structure prevents any changeable data from being stored in the first cluster of a directory stream to prevent propagation of these first-cluster modifications. The modified directory structure is implemented with a process 300, discussed below with reference to FIG. 3.

Figure 3:
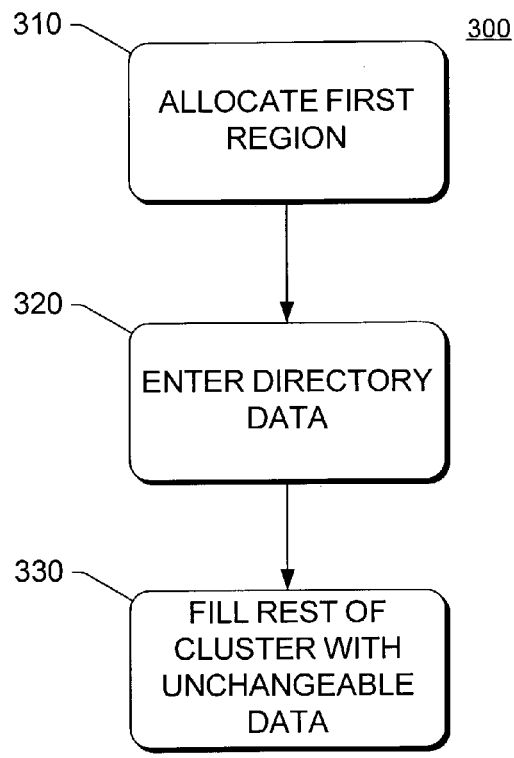
FIG. 3 is a flowchart of an exemplary process for creating directories and subdirectories that finds application with the TFAT file system of FIG. 2.

FIG. 3 is a flowchart of an exemplary process 300 for creating directories and subdirectories that finds application with the TFAT file system 200 of FIG. 2.

The process 300 begins (block 310) by allocating a first region of the non-volatile memory 138 of FIG. 1A. In one embodiment, such corresponds to allocating first and second clusters for a subdirectory.

The process 300 then enters data corresponding to a directory or a subdirectory into a first portion of the directory or subdirectory in a block 320. In one embodiment, such corresponds to a parent directory and to a sector corresponding to the associated directory or subdirectory, i.e., entries analogous to the '.' and '..' entries discussed above.

In a block 330, the process 300 fills a remainder of the first cluster with unchangeable data. In one embodiment, such unchangeable data comprises volume labels. The process 300 then ends.

In many conventional file systems, a single cluster is allocated for each newly created directory. Note that the root directory is a special case, and does not have the '.' or '..' entries present.

In one embodiment of a TFAT volume, when a first cluster is allocated for a new directory or subdirectory, only two DIRENTRYs ('.' and '..' entries) are written when the new directory or subdirectory is created (block 310). The rest of the first cluster is filled (block 330) with data that are typically not overwritten by conventional system operations, i.e., data that are unchangeable. Examples of such data include volume labels.

In this embodiment, a second cluster is also allocated by TFAT (block 310) when the first cluster is allocated and written because the first cluster is already going to be filled (block 330). This embodiment requires a fixed overhead of an additional cluster for each directory. However, the performance gains obtained by not having propagating changes often outweigh the extra space required for each stored data file or subdirectory. In this embodiment, rewriting a directory entry does not cause changes to propagate up or down the directory hierarchy and instead requires relinking the FAT chain for the directory.

Because the first cluster is filled with unchanging data such as volume labels instead of other data that may be changeable, file systems such as those for desktop computers never access the data stored in the portion of the first cluster after the '.' and '..' files or accidentally delete those data. However, such directories cannot be deleted by such types of computers and file systems running on operating systems such as the family of Windows® operating systems produced by Microsoft Corporation for application in desktop computers.

Files added to this directory by desktop-type computers using conventional file systems will also not occupy the first cluster because the first directory cluster is filled with unchangeable data such as volume labels. When a conventional directory is created by such computers, the first cluster will not be filled with data such as volume labels. As a result, file write operations performed by such computers on such directories are not transaction-safe.

For FAT12 and FAT16 file systems, the root directory is in a fixed location on the storage medium and has a fixed size. In such systems, the first root directory cluster cannot be filled with data such as volume labels. In FAT32 file systems, the root directory need not have a fixed location or size, but none of these FAT file systems provide a root directory that is transaction-safe, i.e., one which can be moved or remapped without risk of corruption.

In one embodiment, TFAT employs a first root directory in the conventional location that includes a pointer to a first subdirectory (block 310), which then effectively becomes the working "root" directory. When portions of the first root directory other than the pointer are filled (block 330) with unchangeable data, the data in the first root directory never changes. As a result, the first root directory cannot be corrupted by interruption of a write cycle and thus is transaction-safe. When the first subdirectory is also configured such that the first cluster contains "." and ".." entries followed by unchangeable data, it also is transaction-safe. Additionally, this embodiment is backwards compatible with conventional FAT file systems.

In one embodiment of TFAT, at least two file allocation tables (corresponding to FAT0 214 and FAT1 216 of FIG. 2) are maintained, with one being active and the other being non-active at any one time. When a change occurs to data stored on a mass non-volatile data storage device (e.g., NVM 138 of FIG. 1A) such as a magnetic disk, that change is recorded in the non-active FAT table. In one embodiment, one bit in a master boot record (MBR) controls which FAT table is active.

When the entire write is complete and the non-active FAT table is completely updated to reflect the completed write, the active FAT bit in the MBR is flipped and the previously non-active FAT becomes the active FAT. This newly active TFAT is then copied over the new non-active TFAT. TFAT will only guarantee that the file system will stay intact during power loss. When a write and TFAT update operation is not yet complete and an interruption occurs, data involved in that write operation may be lost and it is up to the application or user to address the data loss.

In one embodiment, the system maintains two FATs. A default TFAT write/file modification proceeds as follows. Initially the FATs are set up with FAT0 as a primary file allocation table and FAT1 as a secondary file allocation table. A write to a volume on a storage medium proceeds as described below with reference to process 400 as shown in the flowchart of FIG. 4.

Figure 4:
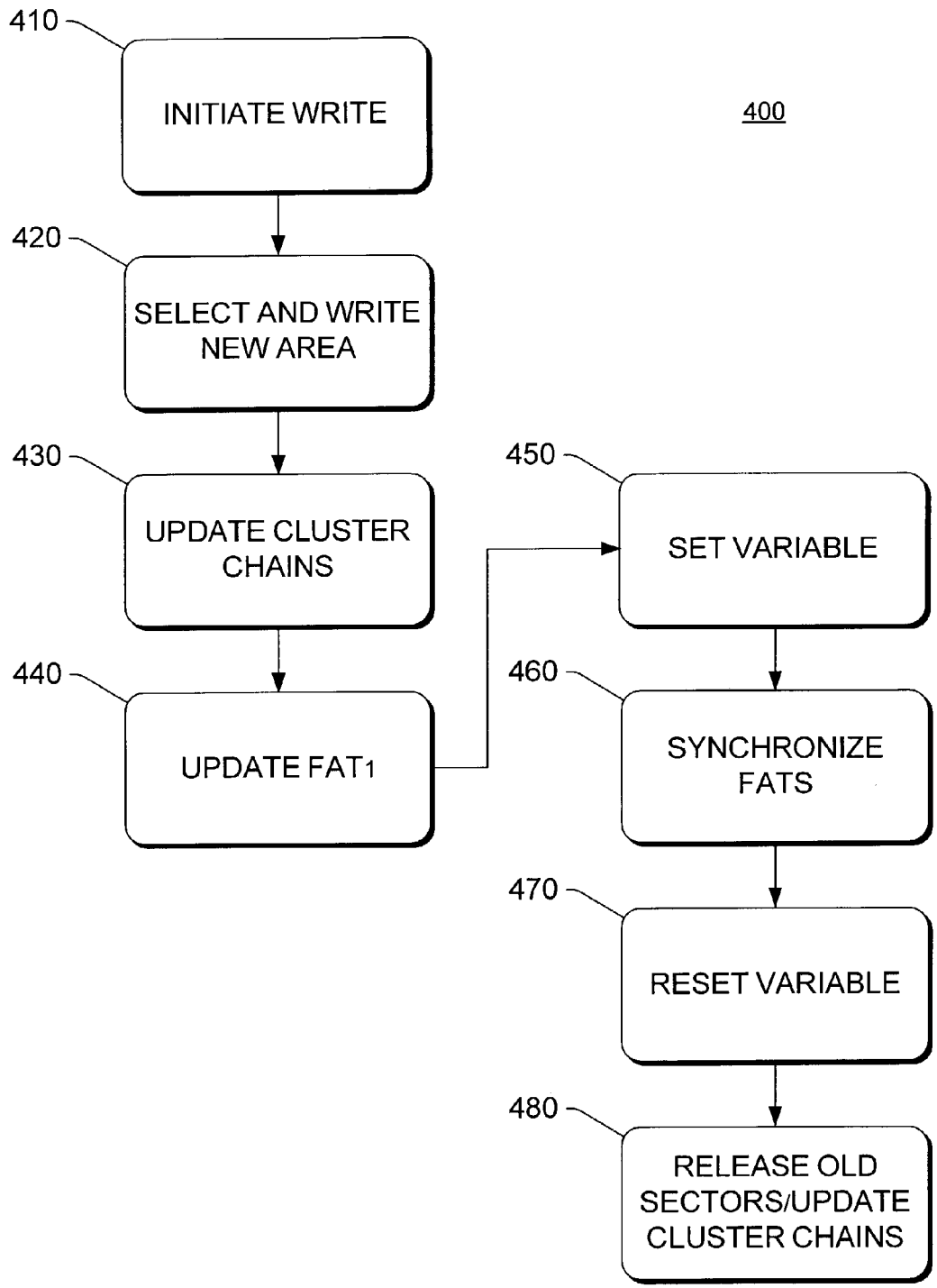
FIG. 4 is a flowchart of an exemplary process for writing data to the non-volatile memory of FIG. 1A that includes the TFAT file system of FIG. 2.

FIG. 4 is a flowchart of an exemplary process 400 for writing data to the non-volatile memory 138 of FIG. 1A that includes the TFAT file system 200 of FIG. 2. In one embodiment, one or more computer readable media (e.g., 138, FIG. 1A) have stored thereon a plurality of instructions that, when executed by one or more processors (e.g., 110, FIG. 1A), causes the one or more processors to modify data represented by at least a first sector on the non-volatile storage medium such that the one or more processors perform acts to effect the process 400.

In block 410, an application initiates a write operation to write data to the volume.

In block 420, the write triggers the memory manager 130 of FIG. 1A to write a new sector of the medium via block drivers. In one embodiment, the application writes a new sector of the storage medium via an atomic block write. In one embodiment, the memory manager 130 of FIG. 1A writes the new sector in response to an instruction to close the file. Writing data to modify a file to a new sector preserves all old data because the sector containing the old data is not overwritten by the new data.

In block 430, cluster chains are updated.

In block 440, used/unused sector information are written in FAT1 (216, FIG. 2). In one embodiment, the processor 100 enters file allocation data including data describing the new sector in a first file allocation table.

In block 450, a variable is set to a first value. In one embodiment, the variable is set to a first value configured to block access to the storage medium by first types of file systems and configured to permit access to the storage medium by second types of file systems, such as the TFAT described in this disclosure. In one embodiment, the first types of file systems may include FAT12, FAT16 or FAT32. In one embodiment, the first value disables conventional file systems from accessing the storage medium. In one embodiment, the variable corresponds to a number of FATs (NOF) field located in the boot sector of the volume.

In block 460, the FAT1 is copied to the FAT0 (214, FIG. 2). This synchronizes FAT1 and FAT0.

In block 470, the variable is reset to a second value. The second value indicates to a TFAT file system that the FAT0 is a last known good FAT. In one embodiment, the second value also enables conventional file systems to access the storage medium. In one embodiment, resetting the variable to a second value permits access to the storage medium by the first and second types of file systems.

In block 480, the clusters corresponding to the previous version of the newly-written data are "unfrozen", that is, are marked as unallocated chains. The previous version of the file is thus recoverable until such time as the new data have been written, the FAT1 has been updated and FAT1 and FAT0 have been synchronized.

The process 400 then ends.

In one embodiment, the variable of block 450 represents a number of FATs (NOF) field. In one embodiment, the first value for the variable is zero and the second value for the variable is two.

In one embodiment, the first two cluster entries of the second FAT table are reserved. All the bits in the second cluster entry are, by default, set to 1. When one of the highest two bits of the second cluster entry is set to 0, conventional desktop computers are likely to be triggered to perform a scandisk utility operation when the operating system is booted. However, it does not trigger any activity when the storage device is inserted and mounted.

This embodiment works well for hard-drive type media because a power failure in hard drive during a write operation can corrupt a sector being written. Because there are two FAT tables, the other FAT table is still available when one of the FAT tables is corrupted, assuming that the block driver will return a read error if the sector is corrupted during a write operation.

Figure 5:
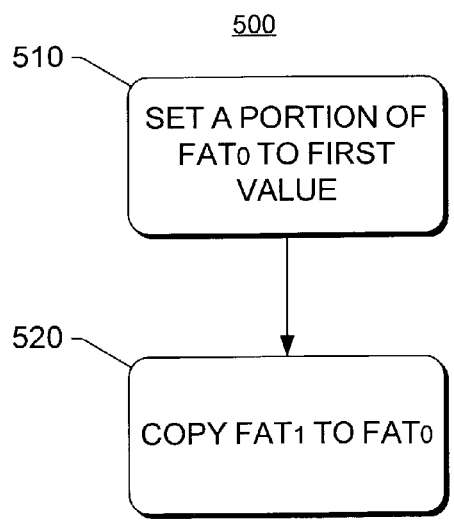
FIG. 5 is a flowchart of an exemplary process for synchronizing TFAT volumes in the TFAT file system of FIG. 2.

At end of each transaction, FAT1 is copied to FAT0 by a process described below with reference to an exemplary process 500 as shown in the flowchart of FIG. 5.

FIG. 5 is a flowchart of an exemplary process 500 for synchronizing TFAT volumes in the TFAT file system 200 of FIG. 2. The process 500 may be implemented by the processor 110 of FIG. 1A, for example.

In block 510, the second cluster entry in FAT0 is set to a first value. In one embodiment, the first value is zero.

In block 520, FAT1 is copied to FAT0, resetting the second cluster entry to a second value. The first sector is copied last. In one embodiment, the second cluster entry is set to all ones. The process 500 then ends.

Figure 6:
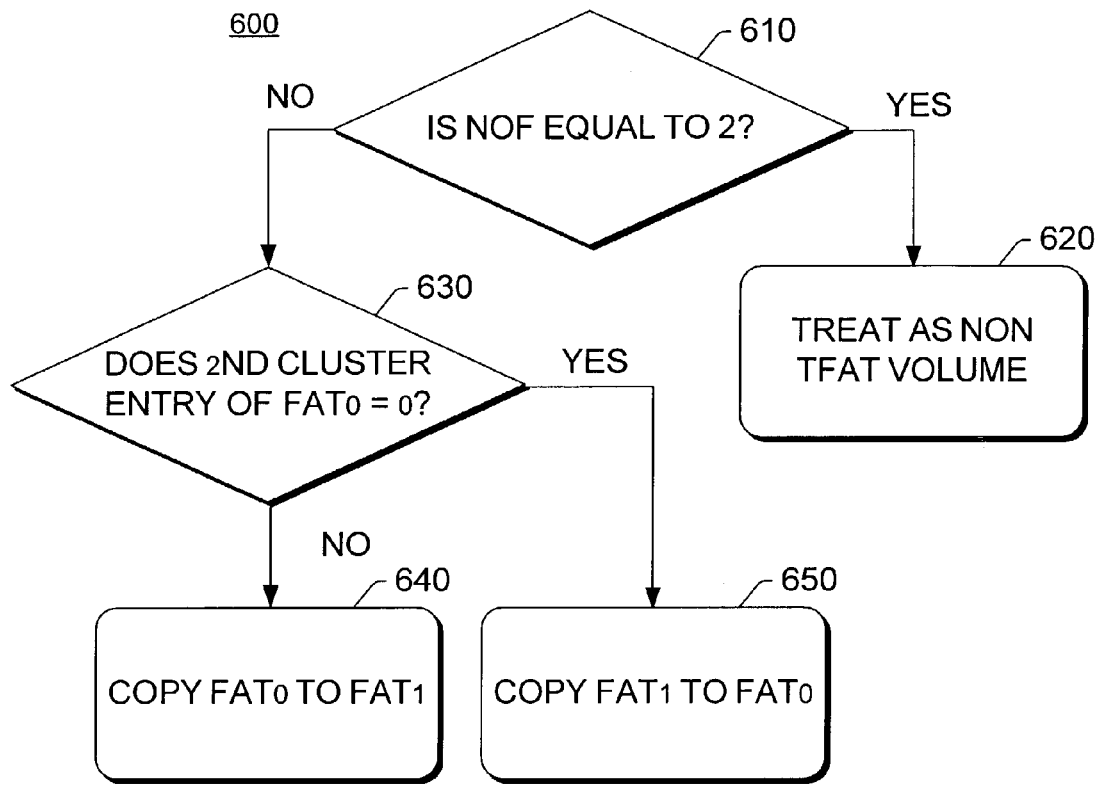
FIG. 6 is a flowchart of an exemplary process for identification of TFAT volumes and to determine which TFAT is the last known good FAT when a volume of non-volatile memory is mounted a system such as the computer system of FIG. 1A.

FIG. 6 is a flowchart of an exemplary process 600 for identification of TFAT volumes and to determine which FAT is the last known good FAT when a volume of non-volatile memory 138 is mounted in a system such as the computer system 100 of FIG. 1A. The process 600 may be implemented by the processor 110 of FIG. 1A, for example. The process 600 begins with query task 610.

When query task 610 determines that NOF is set to 2, the process 600 treats that volume as a non-TFAT volume. In block 620, the process 600 selects FAT0 as the last known good FAT and the process 600 ends. When query task 610 determines that NOF is not 2, control passes to query task 630.

When query task 630 determines that the second cluster entry of FAT0 is not 0, the process 600 treats that volume as a TFAT volume. In block 640, FAT0 is copied to FAT1. The process 600 then ends. When query task 630 determines that the second cluster entry of FAT0 is 0 or determines that the sector-read on the first sector of the FAT0 failed, control passes to block 650.

In block 650, FAT1 is copied to FAT0. The process 600 then ends.

In one embodiment, TFAT includes a registry setting to allow selection between setting NOF to first and second values or second cluster entry values in FAT0 to identify TFAT media and to determine which FAT to employ.

In one embodiment, this registry setting is bit 0x40000 in the "Flags" value of the conventional FAT registry key ("0x" signifies that the number is hexadecimal, i.e., base 16). When this bit is set, TFAT uses the second cluster entry in FAT0 for last known good FAT determination.

In one embodiment, access to the storage medium via conventional file systems is blocked by setting a bit on the storage medium to a value that corresponds to an indication of a defective storage medium.

In one embodiment, the TFAT control module 160 of FIG. 1B causes the FATs, and possibly also the directory file, to be re-written for every file system write. A series of small file system writes compromises system performance because each write to the storage medium is transacted and the TFAT is updated for each of these write operations.

Figure 7:
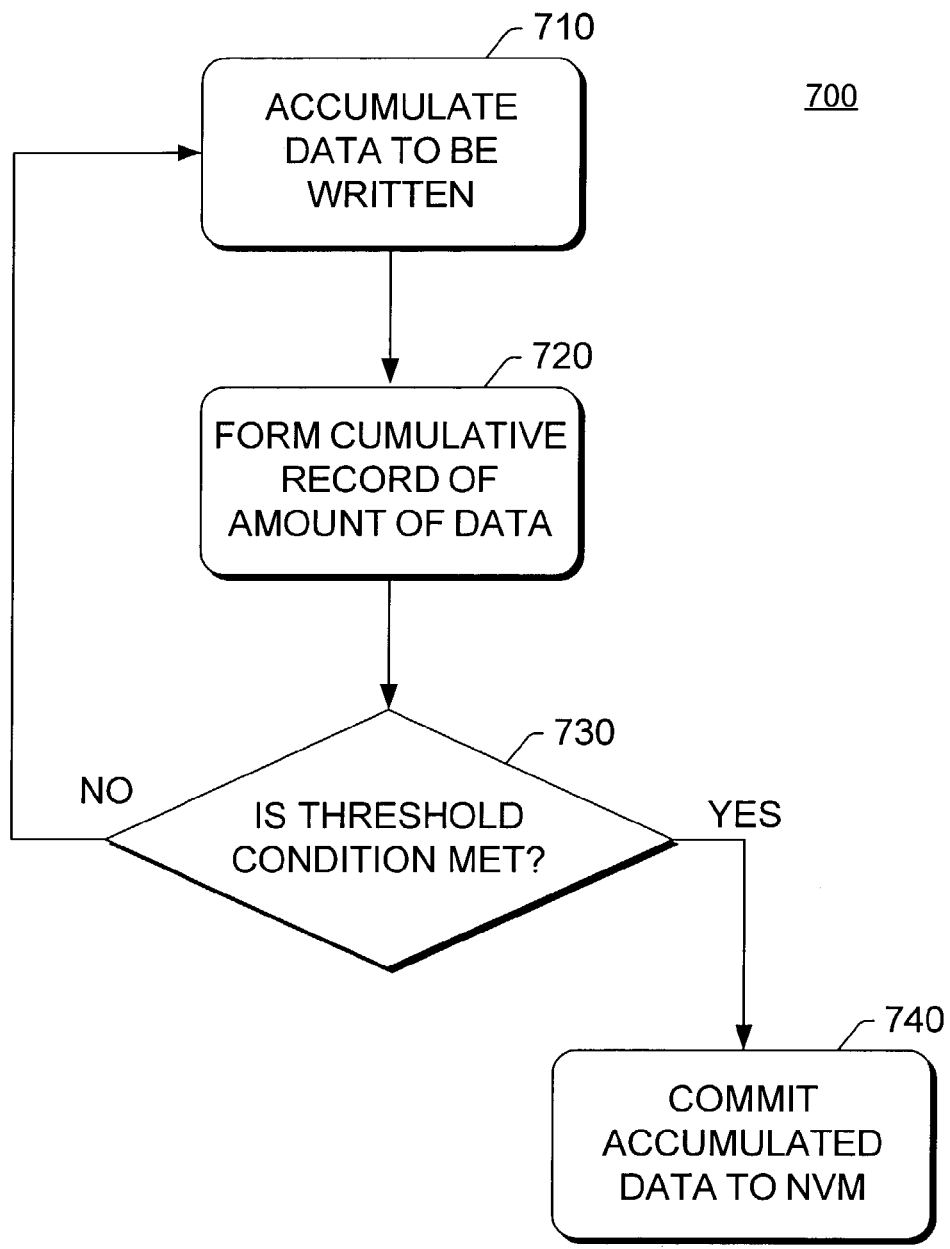
FIG. 7 is a flowchart of an exemplary process for determining when to write data to non-volatile storage media using the TFAT file system of FIG. 2.

FIG. 7 is a flowchart of a process 700 for determining when to write data to non-volatile storage media (e.g., 138, FIG. 1A) using the TFAT file system 200 of FIG. 2. The process 700 may be implemented by the processor 110 of FIG. 1A, for example.

The process 700 begins (block 710) with accumulation (e.g., in RAM 136) of data to be written from a plurality of instructions to write data to the storage medium 138. A cumulative record of an amount of data to be written is maintained (block 720).

A query task 730 tests for presence of a first predetermined threshold condition. In one embodiment, the threshold condition is met at the time when the file is closed. In one embodiment, the threshold condition is met when a predetermined or adjustable amount of data to be written has been accumulated. When the amount of accumulated data is less than the predetermined threshold, control passes back to block 710 to await further write data commands.

When the query task 730 determines that the predetermined threshold condition has been met, the process 700 causes the processor 110 of FIG. 1A to write the accumulated data to the storage medium 138 (block 740). The process 700 then ends.

In one embodiment, the "Delayed Commit" feature allows flexibility to choose whether to commit FAT tables at the time the file is closed or not. In one embodiment, the TFAT control module 160 of FIG. 1B causes the application to merge several small writes into one single one.

However, because a write can fail if there is not enough free storage space in the storage medium, storing very large data blocks (>500 KB) in one single write can result in failure. In order to avoid such write failure, the TFAT control module 160 finds enough free sectors in the volume of storage medium to be able to write a new sector for each sector of data to be written or modified.

Accordingly, in one embodiment, the TFAT control module 160 determines amounts of data to be written in response to individual write commands and accumulates these data until a predetermined threshold quantity of data to be written is achieved. In one embodiment, the threshold may be adjustable as a function of the amount of available storage on the storage medium as that amount fluctuates. In other words, when the amount of unallocated storage medium is small, the threshold may be reduced or smaller, while when the amount of unallocated storage medium is relatively large (at least compared to the amount of storage medium required for each write), the threshold may be increased or larger.

In one embodiment, an intermediate TFAT is created in volatile memory to keep track of the non-volatile memory write operations to be carried out, either at when the file is closed or when the predetermined threshold is achieved. The intermediate TFAT is maintained at least until the FAT1 is updated.

In one embodiment, when a single block of data needs to be modified, the TFAT file system first reads the existing disk block into a system buffer. The TFAT file system then finds and allocates a new cluster on disk. The TFAT is then traversed to find any entries corresponding to the old cluster, and the new cluster is relinked to replace such. This completes the FAT chain modifications. Then the system buffer is "renamed" to correspond to the newly allocated cluster on disk. In one embodiment, it is also marked as "dirty," which causes the system buffer to be written out to disk when the buffer is ever released (avoiding having to perform an immediate and duplicate write; the TFAT control module 160 can modify the buffer, and then write it all out to non-volatile storage at once).

In one embodiment, the approach taken is slightly different. WriteFile can write an arbitrary amount of data to an arbitrary location in a file. In one embodiment, a stream process is used to clone streams.

When there is an attempt to write to an existing part of a stream, this embodiment attempts to allocate enough space for the entire write, or uses the most contiguous space available. Since stream-based operations operate on "runs" (e.g., contiguous blocks of data on storage media such as disks), cloning is performed in the same fashion. An unallocated run of appropriate length is located, and this is termed a "parallel run". For example, if data in a run corresponded to sectors 51–55, a parallel run might be 72–76.

After a parallel run has been allocated, it is linked in to the existing FAT chain for the file, and the stream's current run information is updated with this new information. The rest of the function call proceeds conventionally, except instead of writing to the old run of the file, data are written to the new, parallel run, and the original copy of the run is preserved on the storage medium. This only occurs for data composed of block-sized chunks of data that are block-aligned.

Thus, before any data is written to storage media such as disks, the portion to be written to is reallocated, and the structures updated, so the writes occur to new clusters. When a stream needs to be expanded (i.e., the write is occurring past EOF, the end of the file), then these new clusters are not cloned; there is no backup to preserve.

The strategy outlined by example with respect to processes 300–700 maintains a backup of the most recent "good" version of the FAT in case power is lost during sector writing or FAT updating. In one embodiment, when a power-on reset occurs, NOF=0 means that TFAT file systems will use FAT1 as the valid or last known good FAT; while NOF=2 means that TFAT file systems will use FAT0 as the valid FAT and similarly that desktop-compatible file systems should be able to use FAT0.

This embodiment allows compatibility with existing desktop systems (that do not comprehend TFAT) when a transaction has been completed and the NOF flag=0. It also prevents such a conventional desktop system from reading the volume when power has been lost in mid-transaction, i.e., after the NOF field was set to two but prior to updating of FAT0 and/or resetting of the NOF field.

TFAT can be incorporated in and operate on all sorts of physical storage media. Non-removable media include NAND/NOR flash memory and hard drives. Removable media include Compact-Flash (CF) cards, Secure-Digital (SD) cards, floppy discs and other removable mass storage devices.

In one embodiment, a block driver module associated with the physical mass storage device employs atomic block write operations. In one embodiment, block size equals sector size, e.g., 512 bytes. In one embodiment, TFAT supports any block driver that does atomic sector-size (512 bytes) disk I/O operation.

As used herein, "atomic" means that if a failure happens (due to power cycle or media removal) during a sector-sized write-operation, a read-operation on the same sector at a later time can only have the following three results:
1. Read returns old sector data.
2. Read returns new sector data.
3. Read returns failure.

For some types of NAND-flash media, only the first two results are possible. For hard-drive type media, all three results are possible. For general media and other types of block write module, at least one other possible outcome is that the read operation returns corrupted data. TFAT supports at least those systems and media where atomic block write operations are employed. In one embodiment, TFAT supports media employing transacted block modules.

Because the TFAT file system writes an entire new sector or file when data are modified in any file, TFAT may be slower than conventional FAT file systems. A system employing TFAT may be, for example, 2.5 to 1.05 times slower than a conventional FAT file system. In one embodiment, this ratio can be lowered by committing the write to the TFAT control module 160 when the file is closed instead of with every write to the file.

Figure 8A:
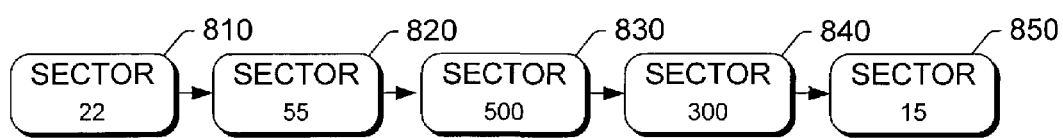
FIGS. 8A and 8B are block diagrams showing relationships between sectors forming an exemplary FAT chain for a given file, before and after a write operation.
Figure 8B:
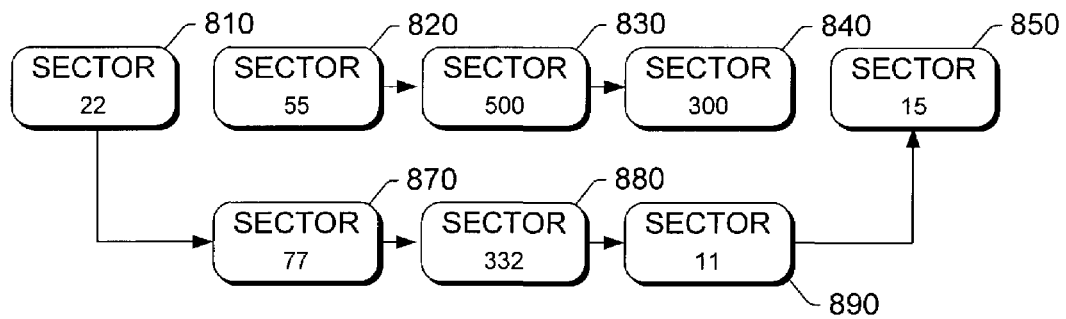

FIGS. 8A and 8B are block diagrams showing relationships between sectors forming a FAT chain for a given file, before and after a write operation. FIG. 8A illustrates a portion 800 of a hypothetical FAT chain for the file prior to a write operation. The portion 800 includes sector 22 (block 810), sector 55 (block 820), sector 500 (block 830), sector 300 (block 840) and sector 15 (block 850). FIG. 8B illustrates a portion 860 of the hypothetical FAT chain after the write operation, which updates the data contained in blocks 820, 820 and 840, but which does not modify the data contained in those blocks. Instead, sector 77 (block 870), sector 332 (block 880) and sector 11 (block 890) are allocated and written, and the FAT chain is updated to reflect the new file structure. In the event that the write process is interrupted by a power failure or other system disturbance, the data contained in the file prior to the write (blocks 810–850) are uncorrupted and thus are recoverable.

The TFAT discussed herein has been described in part in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

For purposes of illustration, programs and other executable program components such as the file system are illustrated herein as discrete blocks, although it is recognized that such programs and components reside at various times in different storage components of the computer, and are executed by the data processor(s) of the computer.

Alternatively, TFAT may be implemented in hardware or a combination of hardware, software, and/or firmware. For example, one or more application specific integrated circuits (ASICs) could be designed or programmed to carry out aspects of the TFAT file system.

Although TFAT has been described in language specific to structural features and/or methodological steps, it is to be understood that the recitation in the appended claims is not necessarily limited to the specific features or steps described. Rather, the specific features and steps are disclosed as preferred forms of implementing the claimed subject matter.

The invention claimed is:

1. A process for maintaining transaction-safe file allocation tables (FATs) for a volume of storage medium, comprising:
triggering, by a write operation, modification of data in an existing sector of a data file by writing of data to a new sector of the storage medium;
recording new sector information into a non-active FAT, wherein one bit in a master boot record controls activity or non-activity of a FAT;
activating the non-active FAT when the write operation is complete by flipping the active FAT bit in the master boot record;
setting a variable to a first value configured to selectively block and allow access to the storage medium;
copying the one activated FAT over a new non-active FAT; and
re-setting the variable to a second value configured to allow access to the storage medium.

2. The process of claim 1, wherein writing the data to a new sector of the storage medium comprises atomically writing the data to a new sector of the storage medium via block drivers.

3. The process of claim 1, further comprising, prior to triggering, allocating a sector of the storage medium, and, after writing the data to a new sector of the storage medium, updating cluster chains.

4. The process of claim 1, wherein setting and resetting the variable comprises setting and resetting a number of FATS field in a boot sector of the storage medium.

5. The process of claim 1, wherein triggering by a write operation comprises committing a write operation to write data to the volume by an application, wherein the volume comprises non-volatile data storage.

6. The process of claim 1, wherein triggering by a write operation comprises committing a write operation by an application to add additional data to a body of data stored on the volume.

7. The process of claim 1, wherein triggering by a write operation comprises committing a write operation by an application to modify a body of data stored on the volume.

8. The process of claim 1, wherein triggering by a write operation comprises writing of any data by an application.

9. The process of claim 1, further comprising, when the variable is set to the first value, blocking access to the medium for operating systems employing a FAT file system chosen from a group consisting of: FAT12, FAT16 and FAT32.

10. The process of claim 1, further comprising blocking access to the medium for operating systems employing a conventional FAT file system when the variable is set to the first value.

11. The process of claim 1, further comprising blocking access to the medium for operating systems employing a conventional FAT file system when the variable is set to the first value but not blocking access to the medium for operating systems employing a conventional FAT file system when the variable is set to the second value.

12. The process of claim 1, further comprising allowing access to the medium for transaction-safe file systems when the variable is set to the first or second value.

13. The process of claim 1, wherein copying the activated FAT over a new non-active FAT comprises copying the activated FAT from the storage medium over a new non-active FAT stored on the storage medium.

14. The process of claim 1, further comprising, following re-setting the variable to the second value, freeing the existing sector.

15. The process of claim 1, wherein setting the variable comprises setting a data field in the non-active FAT and re-setting the variable comprises re-setting a data field in the new non-active FAT.

16. One or more computer readable media having stored thereon a plurality of instructions that, when executed by one or more processors, causes the one or more processors to modify data represented by at least a first sector on a storage medium such that the one or more processors perform acts including:
write a new sector of the storage medium via an atomic block write;
enter file allocation data including data describing the new sector in a non-active file allocation table, wherein one bit in a master boot record controls activity or non-activity of a file allocation table;
activate the non-active file allocation table when the atomic block writing is complete by flipping the active file allocation table bit in the master boot record;
set a variable to a first value configured to block access to the storage medium by first types of file systems and configured to permit access to the storage medium by second types of file systems;
copy the activated file allocation table over a new non-active file allocation table; and
reset the variable to a second value configured to permit access to the storage medium by the first and second types of file systems.

17. The computer readable media of claim 16, wherein the instructions to cause the one or more processors to set a variable to a first value comprise instructions configured to cause the one or more processors to set the variable to a value to block access to the storage medium by operating systems chosen from a group consisting of file allocation table 12, file allocation table 16 and file allocation table 32 and to not block access to the storage medium by transaction-safe file systems.

18. The computer readable media of claim 16, wherein the instructions to cause the one or more processors to modify data include instructions to cause the one or more processors to modify data in response to an instruction to close the file.

19. The computer readable media of claim 16, wherein the instructions to cause the one or more processors to modify data include instructions to cause the one or more processors to:
accumulate data to be written from a plurality of instructions to write data to the storage medium;
determine an amount of accumulated data to be written to the storage medium;
compare the amount of accumulated data to be written to a first predetermined threshold; and
write the accumulated data to the storage medium when the amount of accumulated data exceeds the first threshold.

20. The computer readable media of claim 16, further comprising instructions to:
free the first sector after the variable is reset; and
update cluster chains.

21. The computer readable media of claim 16, wherein instructions to set and reset the variable comprise instructions to set and reset a data field in the new non-active file allocation table.

22. The computer readable media of claim 16, wherein instructions to set and reset the variable comprise instructions to set and reset a number of file allocation tables field in a boot sector of the storage medium.

23. The computer readable media of claim 16, wherein the instructions to cause the one or more processors to modify data include instructions to cause the one or more processors to:
accumulate data to be written from a plurality of instructions to write data to the storage medium;
enter file allocation data relevant to the data to be written in a temporary file allocation table maintained in a volatile storage medium;
determine an amount of accumulated data to be written to the storage medium;
compare the amount of accumulated data to be written to a first predetermined threshold;
write the accumulated data to the storage medium when the amount of accumulated data exceeds the first threshold; and
enter data from the temporary file allocation table into at least one of the activated and new non-active file allocation tables.

24. One or more computer readable media having stored thereon a plurality of instructions that, when executed by one or more processors, causes the one or more processors to modify an existing part of a stream on a storage medium such that the one or more processors perform acts including:
locate unallocated contiguous clusters sufficient to accommodate revised stream portions;
allocate the contiguous sectors;
traverse a non-active file allocation table to locate entries corresponding to the data stream, wherein one bit in a master boot record controls activity or non-activity of a file allocation table;
update the entries to correspond to the contiguous sectors;
set a variable to a first value configured to block access to the storage medium by first types of file systems and configured to permit access to the storage medium by second types of file systems;
write the contiguous sectors with the revised stream portions;
activate the non-active file allocation table when the writing is complete by flipping the active file allocation table bit in the master boot record;

copy the activated file allocation table into a new non-active file allocation table; and reset the variable to a second value configured to permit access to the storage medium by the first and second types of file systems.

25. The computer readable media of claim 24, wherein the instructions to cause the one or more processors to modify an existing part of a stream include instructions to cause the one or more processors to:

accumulate data to be written from a plurality of instructions to write data to the storage medium;

enter file allocation data relevant to the data to be written in a temporary file allocation table maintained in a volatile storage medium;

determine an amount of accumulated data to be written to the storage medium;

compare the amount of accumulated data to be written to a predetermined threshold;

write the accumulated data to the storage medium when the amount of accumulated data exceeds the threshold; and enter data from the temporary file allocation table into at least one of the activated or new non-active file allocation tables.

26. The computer readable media of claim 24, wherein instructions to set and reset the variable comprise instructions to set and reset a data field in the new non-active file allocation table.

27. The computer readable media of claim 24, wherein instructions to set and reset the variable comprise instructions to set and reset a number of file allocation table field in a boot sector of the storage medium.

28. The computer readable media of claim 24, further comprising instructions to:

free sectors corresponding to the data stream after the variable is reset; and update cluster chains.

29. One or more computer readable media having stored thereon a plurality of instructions that, when executed by one or more processors, causes the one or more processors to modify data represented by at least a first sector on a storage medium such that the one or more processors perform acts including:

write a new sector of the storage medium via an atomic block write;

enter file allocation data including data describing the new sector in a non-active file allocation table, wherein one bit in a master boot record controls activity or non-activity of a file allocation table;

set a variable to a first value configured to block access to the storage medium by first types of file systems and configured to permit access to the storage medium by second types of file systems;

activate the non-active file allocation table when the atomic block write is complete by flipping the active file allocation table bit in the master boot record;

copy the activated file allocation table into a new non-active file allocation table; and reset the variable to a second value configured to permit access to the storage medium by the first and second types of file systems.

30. The computer readable media of claim 29, wherein the plurality of instructions that causes the one or more processors to modify data represented by at least a first sector comprises instructions that cause the one or more processors to modify an existing part of a steam of data, and wherein the plurality of instructions further comprise instructions to cause the one or more processors to:

locate unallocated contiguous sectors sufficient to accommodate revised stream portions; and allocate the contiguous sectors;

wherein the instructions to cause the one or more processors to enter file allocation data comprise instructions configured to cause the one or more processors to:

traverse a non-active file allocation table to locate entries corresponding to the data stream; and update the entries to correspond to the contiguous sectors; and wherein the instructions to cause the one or more processors to write a new sector comprise instructions to cause the one or more processors to write the contiguous sectors with the revised stream portions.

31. A computer program product comprising a computer useable medium having computer program logic recorded for maintaining file allocation tables (FATs) for a volume of storage medium, the computer program logic comprising:

means for triggering, by a write operation, modification of data in an existing sector of a data file by writing of data to a new sector of the storage medium;

means for recording new sector information into a non-active FAT, wherein one bit in a master boot record controls activity or non-activity of a FAT;

means for activating the non-active FAT when the write operation is complete by flipping the active FAT bit in the master boot record;

means for setting a variable indicative of a number of FATs (NOF) to a first value configured to selectively block and allow access to the storage medium;

means for copying the activated FAT over a new non-active FAT; and means for re-setting the variable to a second value configured to allow access to the storage medium.

32. The product of claim 31, wherein the means for writing the data to a new sector of the storage medium comprises computer code configured to cause a processor to atomically write the data to a new sector of the storage medium via block drivers.

33. The product of claim 31, further comprising means for blocking access to the medium for operating systems employing a FAT file system chosen from a group consisting of: FAT12, FAT16 and FAT32 when the variable is set to the first value.

34. The product of claim 31, further comprising means for blocking access to the medium for operating systems employing a conventional FAT file system when the variable is set to the first value.

35. The process of claim 31, further comprising means for allowing access to the medium for transaction-safe file systems when the variable is set to the second value.

36. The product of claim 31, further comprising means for allowing access to the medium for transaction-safe file systems when the variable is set to the first or second value.

* * * * *